(12) United States Patent
Zaki et al.

(10) Patent No.: US 9,372,218 B2
(45) Date of Patent: Jun. 21, 2016

(54) DIAGNOSTIC DEVICE FOR CHECKING A CONTROL SIGNAL LINE

(71) Applicant: AUDI AG, Ingolstadt (DE)

(72) Inventors: Sami Zaki, Regensburg (DE); Niklas Schalli, München (DE); Florian Steinlechner, Ingolstadt (DE)

(73) Assignee: AUDI AG, Ingolstadt (DE)

( * ) Notice: Subject to any disclaimer, the term of this patent is extended or adjusted under 35 U.S.C. 154(b) by 0 days.

(21) Appl. No.: 14/420,580

(22) PCT Filed: Jun. 21, 2013

(86) PCT No.: PCT/EP2013/001838
§ 371 (c)(1),
(2) Date: Feb. 9, 2015

(87) PCT Pub. No.: WO2014/023374
PCT Pub. Date: Feb. 13, 2014

(65) Prior Publication Data
US 2015/0219705 A1    Aug. 6, 2015

(30) Foreign Application Priority Data
Aug. 10, 2012   (DE) .......................... 10 2012 015 911

(51) Int. Cl.
*G01R 31/00*   (2006.01)
*B60L 3/12*    (2006.01)
(Continued)

(52) U.S. Cl.
CPC ................ *G01R 31/006* (2013.01); *B60L 3/12* (2013.01); *B60R 16/0232* (2013.01); *G01R 31/02* (2013.01); *G01R 31/021* (2013.01); *G01R 31/40* (2013.01)

(58) Field of Classification Search
CPC ...... G01R 31/02; G01R 31/00; G01R 31/025; G01R 31/021; G01R 31/023
See application file for complete search history.

(56) References Cited

U.S. PATENT DOCUMENTS

| | | | | |
|---|---|---|---|---|
| 5,914,545 A | * | 6/1999 | Pollersbeck | H03K 17/0822 307/131 |
| 8,525,542 B2 | * | 9/2013 | Xiong | G01R 31/2812 307/131 |

(Continued)

FOREIGN PATENT DOCUMENTS

| | | |
|---|---|---|
| DE | 199 48 968 | 4/2001 |
| DE | 100 02 537 | 7/2001 |

(Continued)

OTHER PUBLICATIONS

International Search Report issued by the European Patent Office in International Application PCT/EP2013/001838.

*Primary Examiner* — Huy Q Phan
*Assistant Examiner* — Alvaro Fortich
(74) *Attorney, Agent, or Firm* — Henry M. Feiereisen LLC

(57) ABSTRACT

A diagnostic device for checking a control signal line between a control device of a motor vehicle and a motor-vehicle-side charging connection for a battery of the motor vehicle, includes a first resistor disposed at the charging connection and connecting the control signal line to ground, a second resistor connected in parallel with first resistor to form a parallel circuit, an evaluation device associated with the control device and comprising a current source and/or a voltage source for supplying a corresponding current or voltage outside a charging operation, and a diode connected in series with the first and second resistors and blocking a current flow from ground to the control signal line. The evaluation device is configured to measure, by using the first and second resistor, a current indicating a control signal line defect or a voltage indicating a control signal line defect.

10 Claims, 1 Drawing Sheet

(51) Int. Cl.
*B60R 16/023* (2006.01)
*G01R 31/40* (2014.01)
*G01R 31/02* (2006.01)

(56) References Cited

U.S. PATENT DOCUMENTS

| | | | |
|---|---|---|---|
| 8,551,636 B2 | 10/2013 | Schalli | |
| 2006/0048733 A1* | 3/2006 | Bolz | H02J 7/345 123/179.3 |
| 2008/0231286 A1* | 9/2008 | Tsunekazu | G01R 31/024 324/509 |
| 2009/0039703 A1* | 2/2009 | Soma | B60K 6/28 307/10.1 |
| 2010/0207635 A1* | 8/2010 | Plagens | B60L 3/0023 324/509 |
| 2010/0327878 A1 | 12/2010 | Ishikawa | |
| 2012/0098490 A1* | 4/2012 | Masuda | B60L 3/0069 320/109 |
| 2012/0112697 A1 | 5/2012 | Heuer | |
| 2012/0119702 A1* | 5/2012 | Gaul | B60L 3/0069 320/109 |
| 2012/0146656 A1 | 6/2012 | Hara | |
| 2013/0065095 A1 | 3/2013 | Schalli | |
| 2013/0162261 A1 | 6/2013 | Szoke | |
| 2013/0193932 A1 | 8/2013 | Schalli | |

FOREIGN PATENT DOCUMENTS

| | | |
|---|---|---|
| DE | 10 2004 041 008 | 8/2005 |
| DE | 10 2010 011 162 | 2/2011 |
| DE | 10 2009 025 302 | 7/2011 |
| DE | 10 2010 030 826 | 1/2012 |

* cited by examiner

DIAGNOSTIC DEVICE FOR CHECKING A CONTROL SIGNAL LINE

CROSS-REFERENCES TO RELATED APPLICATIONS

This application is the U.S. National Stage of International Application No. PCT/EP2013/001838, filed Jun. 21, 2013, which designated the United States and has been published as International Publication No. WO 2014/023374 and which claims the priority of German Patent Application, Serial No. 10 2012 015 911.0, filed Aug. 10, 2012, pursuant to 35 U.S.C. 119(a)-(d).

BACKGROUND OF THE INVENTION

The invention relates to a diagnostic device for checking a control signal line between a controller of a motor vehicle and a motor vehicle-side charging terminal for a battery of the motor vehicle. In addition, the invention relates to a motor vehicle and a method for detecting a defect of a control signal line.

Motor vehicles with an electric motor are already widely known in the art, in particular in form of electric motor vehicles or, if they additionally include an internal combustion engine, in form of hybrid vehicles. A battery, usually a high-voltage battery, is provided in the vehicle for operating the electric motor of the motor vehicle. The battery can be charged by suitable charging devices (charging stations) located outside the motor vehicle.

Motor vehicles therefore usually have as part of the charging infrastructure a vehicle side charging connection (charging socket), into which a plug of the charger can be plugged. The charging connection is connected or can be connected to the battery via a single wire or a three-phase wire to allow charging of the battery; in addition, however, a control signal line ("control pilot", abbreviated as CP) is usually present to enable the exchange of control signals. On the one hand, a charge-ready state of the motor vehicle can be communicated to the charging device via the control signal line; however, additionally or alternatively, it is also possible to communicate over the control signal line that the charging device is ready to supply power to the motor vehicle. For example, pulse-width-modulated control signal can be used to exchange information.

On the motor vehicle side, the control signal is evaluated and/or generated in a controller, for example a charging controller and/or battery controller, which includes a corresponding logic device.

If the control signal is not present, for example due to a defect in the control signal line between the controller and the charging connection and/or due to a defect in the charging cable or on the side of the charging device, charging is usually not possible. In particular, however, it is presently not possible to determine whether a fault has occurred in the vehicle itself or in the charging infrastructure, specifically, for example, in the charging cable and/or in the charging device.

SUMMARY OF THE INVENTION

It is therefore an object of the invention to enable checking of a vehicle-side control signal line disposed between a controller of the motor vehicle and a vehicle-side charging connection, which can be easily implemented commensurate with existing standards.

This object is attained with the invention by providing a diagnostic device of the type mentioned above, which is characterized in that a first resistor in the control device connects the control signal line to ground and a second resistor connected in parallel with the first resistor is provided on the charging-connection-side, wherein an evaluation device of the control device has a current source and/or a voltage source for supplying a current and/or a voltage outside a charging operation and is configured to measure a current indicating a control signal line defect or a voltage indicating a control signal line defect by using the first and the second resistor, and wherein a diode blocking a current flow from ground to the control signal line is connected in series with the first and the second resistor.

Thus, with the present invention, a diagnostic device is proposed for the first time which is capable of testing the control signal line from the controller all the way to the charging connection (charging socket), thereby enhancing the diagnostic capabilities in the controller. It is particularly advantageous that this diagnosis can be performed outside the charging process, in particular during the operation of the motor vehicle, and more particular on a regular basis (so-called "open load" diagnostic). It can thus be determined at any time, whether a defect has occurred in the control signal line in the motor vehicle itself.

It is presently already customary, in particular as part of various standards, to provide on the vehicle side in the controller a specific resistor with a certain value disposed between the control signal line and the ground wire. This is particularly true when a charge-ready state should be communicated to the battery by connecting a charge-ready resistor in the controller in parallel with the resistor via a charge-ready switch. Also, the charge-ready resistor may have a standardized value. According to the standard IEC 61851 at the time the present invention was filed, for example, a resistor in a motor vehicle according to the prior art may have value of 2.74Ω, while a charge-ready resistor may have value of 1.3 kΩ or 270Ω. Starting from the prior art, according to the underlying concept of the present invention, the previously single resistor used in the controller is divided into two resistors, namely the currently used conventional first resistor on the controller side and the second resistor connected in parallel with the first resistor on the side of the charging connection. The resistance values of the first and the second resistor can then be selected so that standards are satisfied, for example by using for the first and second resistor a resistance value that is twice as high.

In general, the present invention therefore proposes to use a combination of resistors connected in parallel on both sides of the control signal line within the motor vehicle, namely the first resistor disposed in the controller and the second resistor disposed in the charging connection. When an evaluation device now uses an evaluation circuit that provides different measurement values, depending on whether the second resistor is available, a fault in the control signal line can be readily detected even in the absence of a charging process, which can be accomplished according to the invention by measuring either a current flow or a voltage flow. For this reason, the controller includes a current source or a voltage source, which can be activated outside a charging operation for diagnostic purposes and which generates a measured voltage or a corresponding measured current that depends on the "visibility" of the second resistance. This voltage or current can be readily evaluated, for example by a logic circuit already existing in a controller. For example, a bit indicating an error may be set in the control signal line; alternatively or in addition, an entry may be stored in a fault memory and/or a corresponding warning light for the driver may be activated.

Furthermore, the diagnostic device may include a diode which is connected in series with the first and the second resistor, blocking the current flow from ground to the control signal line. In this way, current flows, which could interfere with the signal evaluation of the control signal and/or for example with test procedures on the charging device side can be prevented from the outset. In particular, it is thus possible to comply with the relevant standardization requirements.

Especially with regard to compliance with standards, the first and the second resistors may advantageously have the same value. Because the first and the second resistor are connected in a parallel circuit, when a certain resistance value is required by a standard, each of the first resistor and the second resistor may, for example, have twice the resistance value of the standard value, so that the standard value "appears" again on the outside due to the parallel connection.

As already described, the charging connection may be designed as a charging socket, with the second resistor being arranged in the charging socket and likewise connecting the control signal line to ground.

Both resistors may be connected to a combined, common ground wire. Frequently, a ground wire is also run from the charging connection to the controller (and also to the battery), so that this already existing ground wire can be used to connect the control signal line to ground via the resistors both on the charging connection side and on the controller side. Any other way to make a connection to ground can also be used, for example a connection to the body of the motor vehicle or the like.

In a first particularly preferred embodiment of the present invention, the evaluation device may have a measuring resistor connected downstream of the voltage source so as to form in conjunction with the first and the second resistor a voltage divider. In other words, a series circuit is formed of the measuring resistor and the parallel circuit of the first and of the second resistor, via which the voltage source is connected to ground. This represents a classic voltage divider. When the measured voltage is tapped between the measuring resistor and the parallel circuit, the measured voltage, as is generally known, depends on the value of the effective resistance of the parallel circuit, i.e. whether the control signal line is sufficiently intact so that the second resistor also contributes to the total resistance of the parallel circuit. If the control signal line is defective, then the second resistor is ultimately replaced by an infinitely large resistance, so that only the first resistor is actually seen in the parallel circuit, which causes a change in the measured voltage.

Consequently, the evaluation device may be designed to detect a control signal line defect when measuring on the parallel circuit formed of the first and the second resistor a voltage that corresponds only to the first resistor. In this case, the already existing logic circuit of the controller, which is able to detect different voltages applied to the parallel circuit, can be used or extended accordingly. For example, it is conceivable to tap the measured voltage, i.e. the voltage indicating a control signal line defect, at the input of an analog-to-digital converter; however, other types of measuring devices and measuring circuits known a person of skill in the art may be used.

In summary, in this first embodiment, the concept of a voltage divider is used to generate with the voltage source different measured voltages applied to the parallel circuit, depending on whether the control signal line is intact or not.

In a second, less preferred embodiment, it is also conceivable to create an evaluation circuit by using the first and the second resistor in which a current is fed by a current source, which produces different values of the measured current, depending on whether the second resistor is accessible. For example, the current source may be designed to apply a predetermined current by connecting the first and the second resistor in parallel, wherein the evaluation device includes a current measuring device for measuring the current flowing through the first resistor. In this embodiment, the parallel circuit is thus used as a current divider. If both resistance values are identical, half the current flows through each of the resistors. If the control signal line is defect, current cannot flow through the second resistor and the total current flows through the first resistor. The current flowing through the first resistor can therefore be measured as a measuring current, indicating when a control signal line is defect. For this embodiment, however, a current measuring device is required, so that already existing components of the logic circuit cannot be used.

In another embodiment of the present invention, the evaluation device may further include switching means for selectively connecting the voltage source and/or the current source for carrying out a diagnostic process outside a charging process. In this way, diagnostic process may be initiated outside of charging processes by closing the switching means wherein the measured voltage and the measured current is then recorded. Such diagnostic processes may be initiated, especially cyclically, by the controller itself or by other controllers, for example as part of a more extensive diagnostic process of the motor vehicle, which may also be performed cyclically.

In addition to the diagnostic device, the present invention also relates to a motor vehicle with a diagnostic device according to the invention. With the diagnostic device according to the invention, such a motor vehicle is therefore able to detect automatically a defect in a control signal line between a charging connection and a controller. All statements regarding the diagnostic device of the present invention can analogously be applied to the motor vehicle according to the invention, so that the aforementioned advantages can also be achieved with the motor vehicle.

Lastly, the present invention also relates to a method for detecting a defect of a control signal line between a controller of a motor vehicle and a motor vehicle-side charging connection for a battery of the motor vehicle, which method is characterized in that a first resistor is used in the controller to connect the control signal line to ground and a second resistor, connected in parallel with the first resistor, is used on the side of the charging connection, wherein outside a charging process a voltage and/or a current is fed into the circuit that includes the first and the second resistor and wherein at another location of the circuit, a current that depends on the availability of the second resistor is measured or a voltage that depends on the availability of the second resistor is measured and evaluated with respect to the control signal line defect. All statements concerning the diagnostic device according to the invention can also be applied to the method according to the invention, which can advantageously be carried out using a diagnostic device according to the invention. It is therefore also checked with the method according to the invention whether the second resistance is accessible and whether therefore the control signal line is defective.

BRIEF DESCRIPTION OF THE DRAWING

Further advantages and details of the present invention will become apparent from the examples and embodiments described below with reference to the drawings. The drawings show in.

DETAILED DESCRIPTION OF PREFERRED EMBODIMENTS

Figure 1:
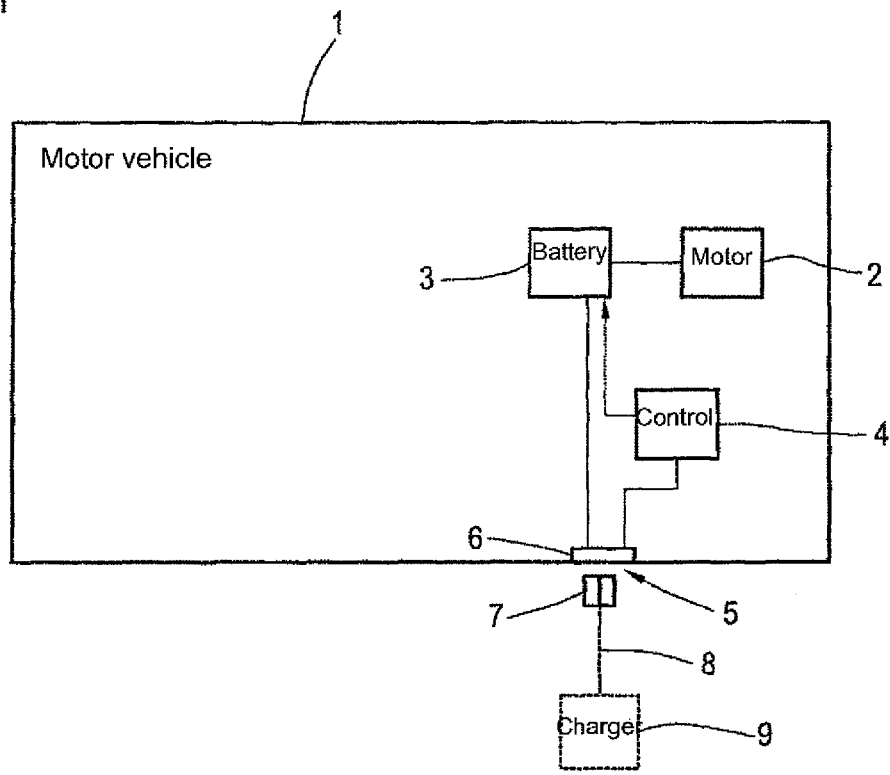
FIG. 1 a schematic diagram of a motor vehicle according to the invention.

FIG. 1 shows a schematic diagram of a motor vehicle 1 according to the invention. Since the motor vehicle 1 is an electric vehicle, it includes an electric motor 2 powered by a battery 3 (high voltage battery). The operation of the battery 3, and in particular also its charging operation, is controlled by the battery controller 4. For charging the battery 3, the motor vehicle 1 includes a charging connection 5 in the form of a charging socket 6, wherein control signals are transmitted to the controller 4, while energy is being transferred to the battery 3.

The motor vehicle 1 can be connected to a charging device 9 (charging station) by way of a plug 7 of an only schematically indicated charging cable 8, thereby enabling a charging process.

The charging process is determined in part by control signals, which can be exchanged between the controller 4 and the charging device 9. A special control signal connection (control pilot) is provided for this purpose.

Figure 2:
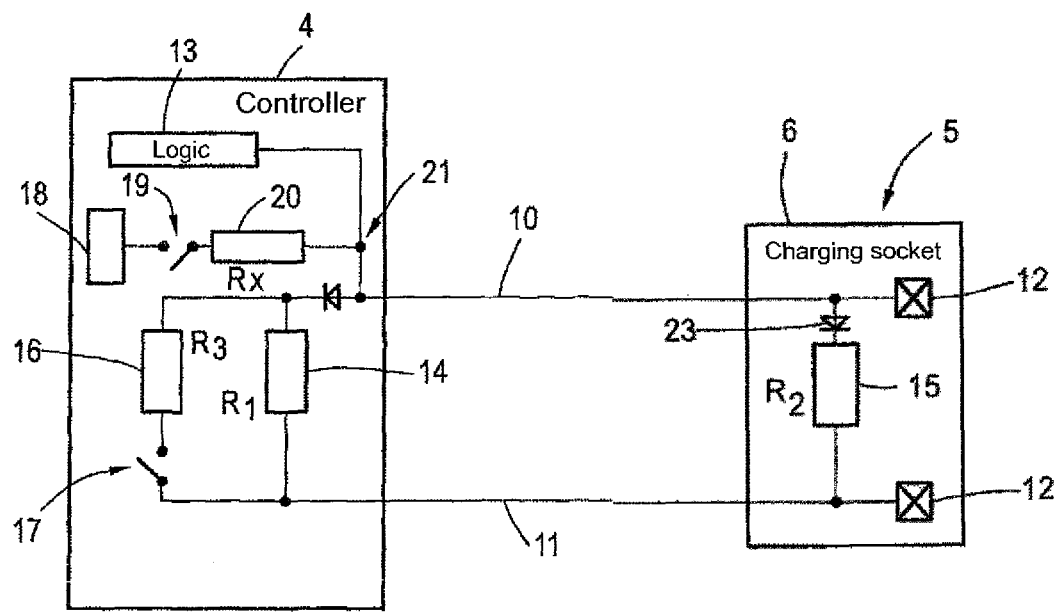
FIG. 2 a diagram illustrating the operation of the diagnostic device according to the invention.

FIG. 2 shows in more detail the implementation of the connection between the controller 4 and the charging connection 5 inside the motor vehicle 1. For sake of clarity, power supply lines and the like are not shown. A control signal line 10 and a ground wire 11 connected to corresponding pins 12 are provided between the charging socket 6 and the controller 4. As indicated, the signal of the control signal line 10 is forwarded to a logic circuit 13 of the controller 4, where it can be evaluated in a conventional manner.

As will now be illustrated in more detail below, the controller 4 is configured to perform the method according to the invention; for this purpose, components of a diagnostic device according to the invention are realized in the charging connection 5 as well as in the controller 4.

The control signal line 10 is connected in the controller 4 to the ground wire 11 by way of a first resistor 14. A second resistor 15 inside the charging socket 6 is connected in parallel with the first resistor 14 and also connects the control signal line 10 to the ground wire 11. The value $R_1$ of the first resistor 14 is in this example identical to the value $R_2$ of the second resistor 15 so that the parallel circuit formed of the first resistor 14 and second resistor 15 acts as a single resistor having half the resistance value of $R_1$ and/or $R_2$. In the present example, $R_1=R_2=5.48$ k$\Omega$, so that the effective resistance of the parallel circuit is 2.74 k$\Omega$, thus satisfying a standard based on a charge-ready state resistor 16 having the value $R_3=1.3$ k$\Omega$. A charge-ready state switch 17 is associated with the charge-ready state resistor 16, wherein the charge-ready state switch 17 is closed when a charge-ready state of the battery 3 is indicated, which enables detection of a change in resistance by a charging device.

However, because the diagnostic process according to the invention takes place outside the charging process, the charge-ready state switch 17 is open anyway, so that only the parallel-connected resistors 14 and 15 are relevant. By arranging the second resistor 15 on the side of the charging connection, a diagnosis of the control signal line 10 is made possible by using an evaluation device, as explained in more detail below.

As part of the evaluation device, a voltage source 18 is provided inside the controller 4. When a switching means 19 is closed for initiating the diagnostic operation, the voltage source 18 is coupled to the parallel circuit composed of the resistors 14 and 15 via a measuring resistor 20 having the resistance value $R_x$; in other words, the measuring resistor 20 and the parallel circuit formed of the resistors 14 and 15 are connected in series with respect to the voltage source, thus resulting in a voltage divider, meaning that the measured voltage tapped at the point 21 depends on the resistance value of the parallel circuit formed of the resistors 14 and 15.

The value of the measured voltage 21 can be measured via the logic circuit 13, optionally suitably expanded, during the diagnostic process, which takes place outside the charging process, wherein the measured voltage value depends on whether the second resistor 15 is accessible, i.e. on whether the control signal line 10 is intact.

If the control signal line 10 is intact, then the parallel circuit has the effective resistance of the two parallel-connected resistors 14 and 15, and consequently $$R_p = \frac{R_1 * R_2}{R_1 + R_2} = \frac{R_1}{2},$$

as already explained above. However, if the control signal line 10 is defective, an infinitely large resistance is assumed instead of the second resistor 15, so that effectively only the first resistor $R_1$ can be detected in the parallel circuit 14. Accordingly, different voltages are produced that can be associated with a defect in the control signal line 10.

As already stated, the measurement voltage can be readily detected and measured by way of the logic circuit 13, which already evaluates the transmitted, in particular pulse-width-modulated, control signals, for example at the input of an analog-to-digital converter or of another voltage measuring device. An error bit can be set depending on the value of the measured voltage, i.e. the information whether a control signal line defect is present or not, an entry can stored in a fault memory and/or a warning light for the driver can be controlled. However, other measures are also conceivable. The diagnostic process described herein, can for example be performed cyclically for the duration when the switching means 19 is closed. The switching means 19 is then opened again following completion of the measurement. A diagnostic process does not take place while a charging process is taking place. The switching means 19 is then generally open.

In the exemplary embodiment of the present invention illustrated in FIG. 2, a voltage divider is formed as an evaluation circuit, which is fed from the voltage source 18. In alternative exemplary embodiments, however, it is also conceivable to use a current source which generates a corresponding variable output current at a different location of the modified evaluation circuit, for example similar to a current divider.

A respective diode 22, 23 is connected in series upstream of the first resistor 14, or of the parallel circuit formed of the resistors 14, 16, as well as upstream of the second resistor 15; however, the diodes 22, 23 may also be arranged with respect to ground 11. This prevents a current flow from ground 11 in the direction of the control signal line 10.

The invention claimed is:

1. A diagnostic device for checking a control signal line between a control device of a motor vehicle and a motor-vehicle-side charging connection for a battery of the motor vehicle, comprising:

a first resistor disposed in the control device and connecting a first end of the control signal line to ground, a second resistor disposed in the motor-vehicle-side charging connection and having one terminal connected to ground and another terminal connected to a second end of the control signal line,
a first diode connected in series with the first resistor and blocking a current flow from ground to the first end of the control signal line,
a second diode connected in series with the second resistor and blocking a current flow from ground to the second end of the control signal line,
wherein the series connection of the first resistor and the first diode and the series connection of the second resistor and the second diode form a parallel circuit, and
an evaluation device associated with the control device and comprising at least one of a current source and a voltage source for supplying a corresponding current or voltage outside a charging operation,
wherein the evaluation device is configured to measure, by using the first and second resistor, a current indicating a control signal line defect or a voltage indicating a control signal line defect.

2. The diagnostic device of claim 1, wherein the first resistor and the second resistor have identical resistance values.

3. The diagnostic device of claim 1, wherein the second resistor is arranged in a charging socket.

4. The diagnostic device of claim 1, wherein the first resistor and the second resistor are connected to a common ground wire.

5. The diagnostic device of claim 1, wherein the evaluation device comprises a measuring resistor connected downstream of the voltage source so as to form a voltage divider in conjunction with the parallel circuit formed of the first resistor and the second resistor.

6. The diagnostic device of claim 5, wherein the evaluation device is configured to detect a control signal line defect when a voltage corresponding to only the first resistor is measured across the parallel circuit formed of the first resistor and the second resistor.

7. The diagnostic device of claim 1, wherein the current source is configured to apply a predetermined current through the parallel circuit formed of the first resistor and the second resistor, and wherein the evaluation device comprises a current measuring device for measuring a current flowing through the first resistor.

8. The diagnostic device of claim 1, wherein the evaluation device further comprises a switching device for selectively connecting at least one of the voltage source and the current source for performing a diagnostic operation outside the charging operation.

9. A motor vehicle comprising a diagnostic device for checking a control signal line between a control device of a motor vehicle and a motor-vehicle-side charging connection for a battery of the motor vehicle, comprising:
a first resistor disposed in the control device and connecting a first end of the control signal line to ground,
a second resistor disposed in the motor-vehicle-side charging connection and having one terminal connected to ground and another terminal connected to a second end of the control signal line,
a first diode connected in series with the first resistor and blocking a current flow from ground to the first end of the control signal line,
a second diode connected in series with the second resistor and blocking a current flow from ground to the second end of the control signal line,
wherein the series connection of the first resistor and the first diode and the series connection of the second resistor and the second diode form a parallel circuit, and
an evaluation device associated with the control device and comprising at least one of a current source and a voltage source for supplying a corresponding current or voltage outside a charging operation, and
wherein the evaluation device is configured to measure, by using the first and second resistor, a current indicating a control signal line defect or a voltage indicating a control signal line defect.

10. A method for detecting a control signal line defect of a control signal line arranged between a control device of a motor vehicle and a motor-vehicle-side charging connection for a battery of the motor vehicle, comprising:
connecting a first end of the control signal line to ground by way of a series connection formed from a first resistor and a first diode disposed in the control device, with the first diode blocking a current flow from ground to the first end of the control signal line, and
connecting a second end of the control signal line to ground by way of a series connection formed from a second resistor disposed and a second diode disposed at the charging connection side, with the second diode blocking a current flow from ground to the second end of the control signal line,
wherein the series connection of the first resistor and the first diode and the series connection of the second resistor and the second diode form a parallel circuit,
feeding at least one of a voltage and a current into the circuit comprising the first and the second resistor outside a charging operation, and
measuring and evaluating at another location of the circuit a voltage that depends on an availability of the second resistor or a current that depends on the availability of the second resistor with respect to the control signal line defect.

* * * * *